(12) United States Patent  
Sekiya

(10) Patent No.: US 11,511,374 B2  
(45) Date of Patent: Nov. 29, 2022

(54) SILICON WAFER FORMING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 551 days.

(21) Appl. No.: 16/046,477

(22) Filed: Jul. 26, 2018

(65) Prior Publication Data

US 2019/0039187 A1 Feb. 7, 2019

(30) Foreign Application Priority Data

Aug. 4, 2017 (JP) .............................. JP2017-151913

(51) Int. Cl.
| | |
|---|---|
| *B23K 26/53* | (2014.01) |
| *H01L 23/544* | (2006.01) |
| *B23K 26/352* | (2014.01) |
| *B28D 5/04* | (2006.01) |
| *B28D 5/00* | (2006.01) |
| *B23K 103/00* | (2006.01) |
| *B28D 1/22* | (2006.01) |

(52) U.S. Cl.
CPC ............ *B23K 26/53* (2015.10); *B23K 26/355* (2018.08); *B28D 5/0011* (2013.01); *B28D 5/047* (2013.01); *H01L 23/544* (2013.01); *B23K 2103/50* (2018.08); *B28D 1/221* (2013.01); *H01L 2223/54433* (2013.01)

(58) Field of Classification Search
CPC .............................. B23K 26/53; B23K 26/355
See application file for complete search history.

(56) References Cited

U.S. PATENT DOCUMENTS

| | | | | |
|---|---|---|---|---|
| 5,761,111 A | * | 6/1998 | Glezer | G11B 7/0045 365/106 |
| 6,752,701 B1 | * | 6/2004 | Honda | B24B 7/228 451/41 |
| 2001/0021594 A1 | * | 9/2001 | Yoo | H01L 21/76819 438/784 |

(Continued)

FOREIGN PATENT DOCUMENTS

| | | | |
|---|---|---|---|
| CN | 203031424 U | * | 7/2013 |
| JP | 06091633 A | | 5/1994 |

(Continued)

OTHER PUBLICATIONS

Teshirogi, et al. "Wideband circularly polarized array antenna with sequential rotations and phase shift of elements," Proc. of ISAP'85, 024-3, pp. 117-120, 1985.

*Primary Examiner* — Nicholas R Krasnow

(74) *Attorney, Agent, or Firm* — Greer, Burns & Crain, Ltd.

(57) ABSTRACT

A silicon wafer forming method includes: a block ingot forming step of cutting a silicon ingot to form block ingots; a planarizing step of grinding an end face of the block ingot to planarize the end face; a separation layer forming step of applying a laser beam of such a wavelength as to be transmitted through silicon to the block ingot, with a focal point of the laser beam positioned in the inside of the block ingot at a depth from the end face of the block ingot corresponding to the thickness of the wafer to be formed, to form a separation layer; and a wafer forming step of separating the silicon wafer to be formed from the separation layer.

8 Claims, 8 Drawing Sheets

(56) References Cited

U.S. PATENT DOCUMENTS

| | | | | |
|---|---|---|---|---|
| 2001/0051683 | A1* | 12/2001 | Honma | B28D 5/0082 524/425 |
| 2002/0144641 | A1* | 10/2002 | Inagaki | C30B 29/06 117/13 |
| 2003/0003608 | A1* | 1/2003 | Arikado | H01L 23/544 438/14 |
| 2003/0036281 | A1* | 2/2003 | Aminzadeh | G03F 9/7026 438/707 |
| 2003/0190794 | A1* | 10/2003 | Ohmi | H01L 21/2007 438/458 |
| 2004/0025983 | A1* | 2/2004 | Morita | C30B 33/00 148/562 |
| 2004/0157536 | A1* | 8/2004 | Strasbaugh | B24B 7/228 451/41 |
| 2005/0217560 | A1* | 10/2005 | Tolchinsky | H01L 21/76254 117/11 |
| 2007/0260341 | A1* | 11/2007 | Wu | H01L 21/67265 700/95 |
| 2009/0223539 | A1* | 9/2009 | Gibbel | H01L 21/67057 134/2 |
| 2010/0038757 | A1* | 2/2010 | Isogai | C30B 29/06 257/655 |
| 2011/0248372 | A1* | 10/2011 | Kurita | H01L 21/322 257/443 |
| 2013/0233237 | A1* | 9/2013 | Bender | C30B 29/06 117/31 |
| 2015/0303049 | A1* | 10/2015 | Tanaka | B24B 7/228 451/41 |
| 2017/0222056 | A1* | 8/2017 | Sawai | H01L 23/5283 |

FOREIGN PATENT DOCUMENTS

| | | | |
|---|---|---|---|
| JP | 2006263837 A | * | 10/2006 |
| JP | 2011077413 A | * | 4/2011 |
| JP | 2013124206 A | * | 6/2013 |

* cited by examiner

SILICON WAFER FORMING METHOD

BACKGROUND OF THE INVENTION

Field of the Invention

The present invention relates to a silicon wafer forming method for forming a silicon wafer from a silicon ingot.

Description of the Related Art

Devices such as integrated circuits (ICs) and large scale integrated circuits (LSIs) are formed, in a state of being partitioned by a plurality of division lines (streets), in a functional layer or layers stacked on a front surface of a wafer formed of silicon. The wafer formed with the devices is subjected to processing of the division lines by a dicing apparatus or a laser processing apparatus to be divided into individual device chips, and the thus divided device chips are utilized for electrical apparatuses such as mobile phones and personal computers.

The wafer to be formed with the devices is formed by slicing a silicon ingot by a cutting machine such as a wire saw and an inner saw (see, for example, Japanese Patent Laid-open No. 1994-91633).

SUMMARY OF THE INVENTION

However, when the silicon ingot is sliced by a cutting machine such as a wire saw and an inner saw to form silicon wafers, the margin for slicing is comparatively large and most part (approximately 60% to 70%) of the silicon ingot is discarded, resulting in poor productivity.

It is therefore an object of the present invention to provide a silicon wafer forming method by which silicon wafers can be efficiently formed from a silicon ingot.

In accordance with an aspect of the present invention, there is provided a silicon wafer forming method for forming a silicon wafer from a silicon ingot, including: a block ingot forming step of cutting the silicon ingot to form a block ingot; a planarizing step of grinding an end face of the block ingot to planarize the end face; a separation layer forming step of applying a laser beam of such a wavelength as to be transmitted through silicon to the block ingot, with a focal point of the laser beam positioned in the inside of the block ingot at a depth from the end face of the block ingot corresponding to the thickness of the wafer to be formed, to form a separation layer; and a wafer forming step of separating the silicon wafer to be formed from the separation layer, after the separation layer forming step is performed.

Preferably, the silicon wafer forming method further includes a crystal orientation forming step of forming the silicon ingot with an orientation flat or a notch indicative of crystal orientation, before the block ingot forming step. Preferably, the silicon wafer forming method further includes a production history forming step of applying a laser beam of such a wavelength as to be transmitted through silicon to the silicon wafer to be formed, with a focal point of the laser beam positioned in the inside of the silicon wafer to be formed in a region not to be formed with devices, to form a production history. Preferably, the production history formed in the production history forming step includes one of lot number of the block ingot, order of the wafer to be formed, date of production, production facility, and machine model contributing to the forming.

According to the silicon wafer forming method of the present invention, the margin for slicing of the silicon ingot can be reduced, and, therefore, silicon wafers can be efficiently formed from a silicon ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
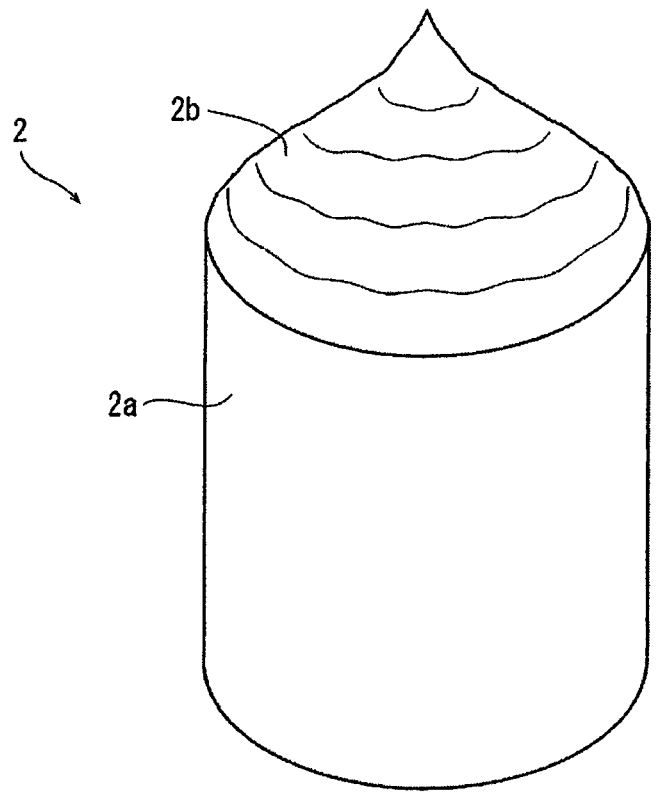
FIG. 1 is a perspective view of a silicon ingot.
Figure 2:
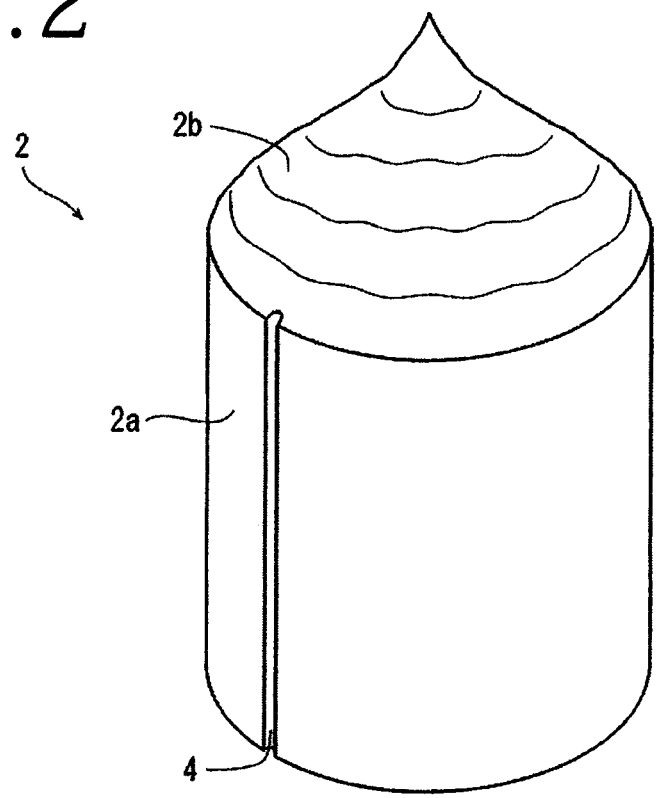
FIG. 2 is a perspective view of the silicon ingot which has been subjected to a crystal orientation forming step.
Figure 3:
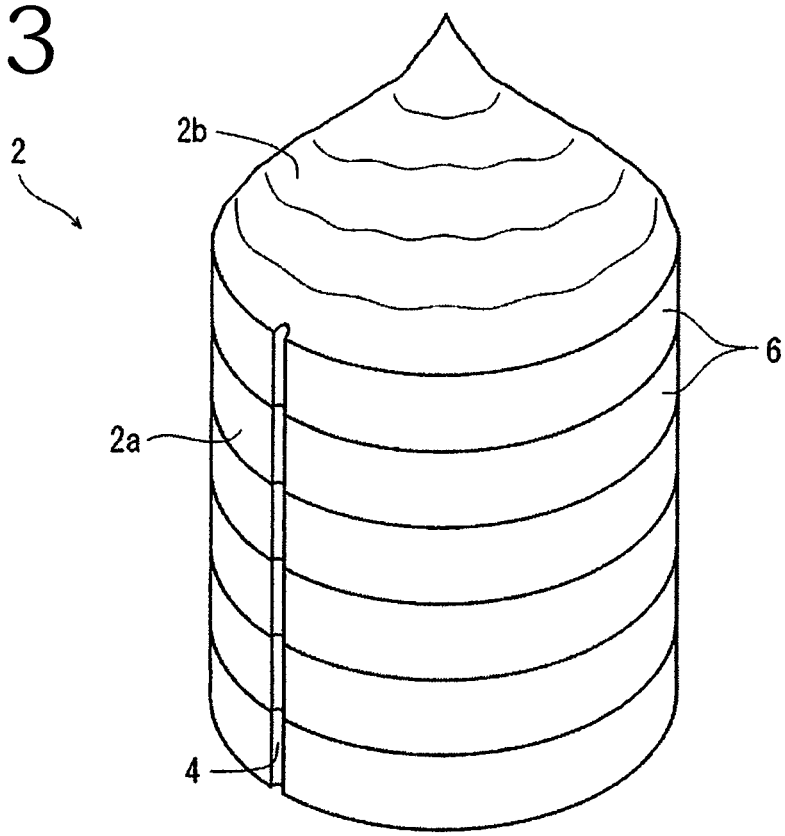
FIG. 3 is a perspective view of the silicon ingot which has been subjected to a block ingot forming step.

An embodiment of a silicon wafer forming method of the present invention will be described below, referring to the drawings. A silicon ingot 2 depicted in FIG. 1 has a cylindrical portion 2a and a conical portion 2b extending upward from an upper end of the cylindrical portion 2a. In the present embodiment, first, a crystal orientation forming step of forming the silicon ingot 2 with an orientation flat or a notch indicative of crystal orientation is performed. In the crystal orientation forming step in the present embodiment, a notch 4 extending vertically is formed in a circumferential surface of the cylindrical portion 2a of the silicon ingot 2, as depicted in FIG. 2. After the crystal orientation forming step is conducted, a block ingot forming step of cutting the silicon ingot 2 by an appropriate cutting machine such as an inner saw or a wire saw to form cylindrical block ingots 6, as depicted in FIG. 3, is performed. The thickness (axial size) of the block ingots 6 may be, for example, approximately 20 to 40 mm.

Figure 4:
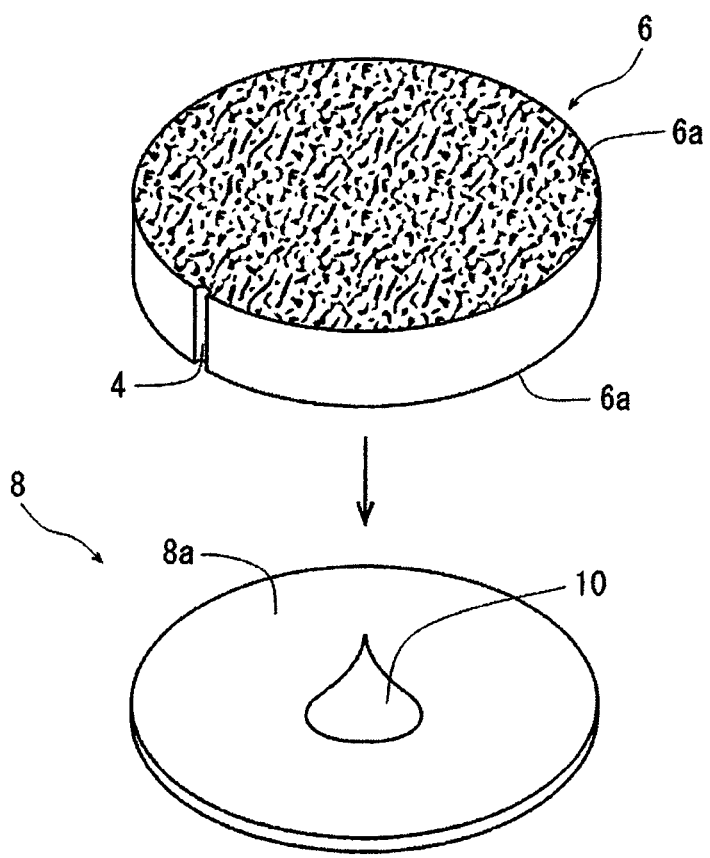
FIG. 4 is a perspective view depicting a state in which a resin layer coating step is being conducted.

In the present embodiment, after the block ingot forming step is conducted, a resin layer coating step of coating one of circular end faces 6a (which are cut surfaces) of the block ingot 6 with a resin layer having a flat outer surface is carried out. Referring to FIG. 4, in the resin layer coating step, first, a liquid resin 10 such as an epoxy resin is dropped onto a flat surface 8a of a base member 8. Next, the block ingot 6 is placed on the base member 8, and the liquid resin 10 is solidified in the state where the liquid resin 10 is sandwiched between the flat surface 8a of the base member 8 and one of the end faces 6a of the block ingot 6. Subsequently, the base member 8 is peeled from a circular disk-shaped resin layer 12 (see FIG. 5) formed by solidification of the liquid resin 10 correspondingly to the shape of the end face 6a of the block ingot 6. As a result, one of the end faces 6a of the block ingot 6 can be coated with the resin layer 12 having a flat outer surface. Note that the base member 8 need only have the flat surface 8a larger in area than the end face 6a of the block ingot 6, and may not be circular disk-shaped as depicted in FIG. 4. In addition, the material of the base member 8 need only be a material which can be peeled from the resin layer 12 formed by solidification of the liquid resin 10, and, for example, a glass material or a metallic material can be used.

Figure 5:
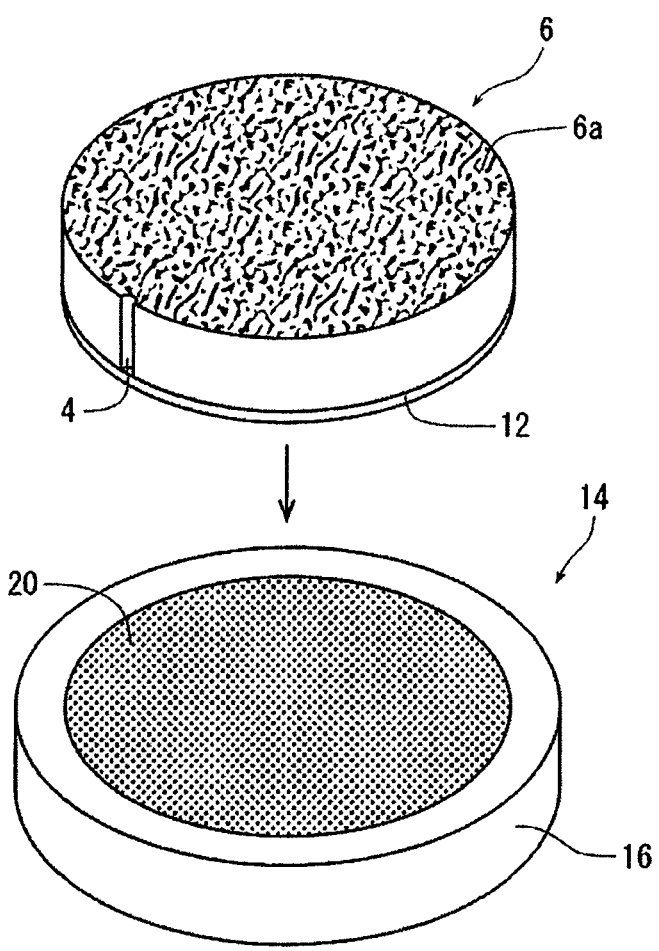
FIG. 5 is a perspective view depicting a state in which a block ingot is placed on a chuck table of a grinding apparatus.
Figure 6:
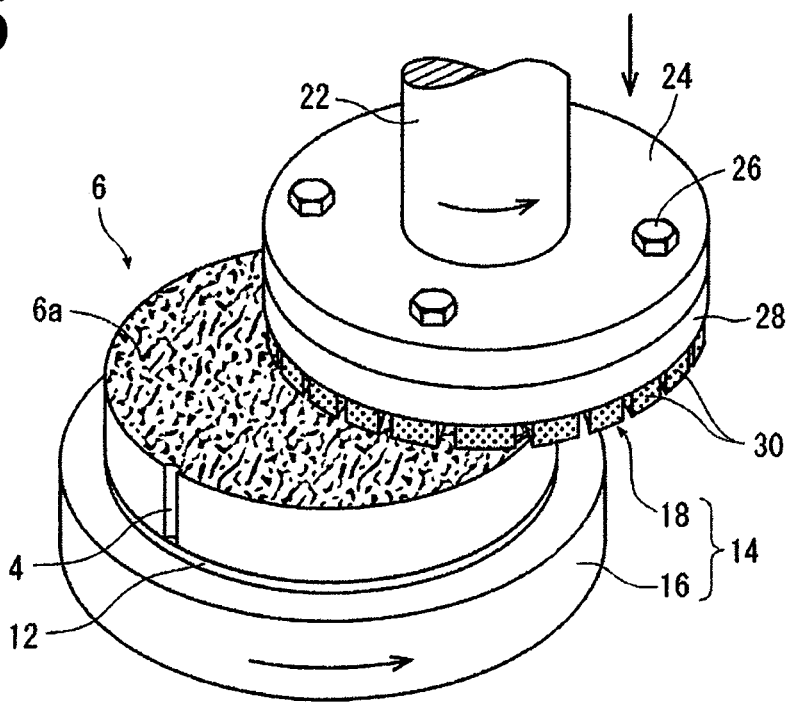
FIG. 6 is a perspective view depicting a state in which a planarizing step is being conducted.

After the resin layer coating step is conducted, a planarizing step of grinding the end face 6a of the block ingot 6 to planarize the end face 6a is performed. The planarizing step can be carried out by using, for example, a grinding apparatus 14 part of which is depicted in FIGS. 5 and 6. The grinding apparatus 14 includes a chuck table 16 that holds the ingot, and a grinding unit 18 that grinds the ingot held by the chuck table 16. As depicted in FIG. 5, a circular suction chuck 20 formed from a porous material and extending substantially horizontally is disposed on an upper surface of the chuck table 16. The suction chuck 20 is connected to suction means (not depicted) through a passage. At the chuck table 16, a suction force is generated at the upper surface of the suction chuck 20 by the suction means, whereby the ingot placed on the upper surface of the suction chuck 20 can be held by suction. In addition, the circular chuck table 16 is rotated about an axis extending vertically while passing through a radial center of the chuck table 16 by a rotating unit (not depicted). As depicted in FIG. 6, the grinding unit 18 includes a cylindrical spindle 22 connected to a motor (not depicted) and extending vertically, and a circular disk-shaped wheel mount 24 fixed to a lower end of the spindle 22. An annular grinding wheel 28 is fixed to a lower surface of the wheel mount 24 by bolts 26. To an outer peripheral edge portion of the lower surface of the grinding wheel 28 are fixed a plurality of grindstones 30 arranged in an annular pattern at intervals along the circumferential direction. In addition, the rotational center of the grinding wheel 28 is displaced from the rotational center of the chuck table 16 in such a manner that the grindstones 30 pass the rotational center of the chuck table 16. Therefore, in the case where the upper surface of the ingot held on the upper surface of the chuck table 16 and the grindstones 30 make contact with each other while the chuck table 16 and the grinding wheel 28 are being rotated mutually, the whole part of the upper surface of the ingot is ground by the grindstones 30.

As depicted in FIG. 5, in the planarizing step, first, the block ingot 6 is placed on the upper surface of the chuck table 16, with the resin layer 12 directed to the lower side, and the suction means connected to the suction chuck 20 is operated. Then, the upper surface of the suction chuck 20 and the outer surface of the resin layer 12 make close contact with each other because the outer surface of the resin layer 12 is flat, and the outer surface of the resin layer 12 is suction held with a predetermined suction force by the suction chuck 20, with no air being sucked in through a gap between the suction chuck 20 and the resin layer 12. Next, as depicted in FIG. 6, the chuck table 16 is rotated by the rotating unit at a predetermined rotational speed (for example, 300 rpm) counterclockwise as viewed from above. In addition, the spindle 22 is rotated by the motor at a predetermined rotational speed (for example, 6,000 rpm) counterclockwise as viewed from above. Subsequently, the spindle 22 is lowered by a lift unit (not depicted) of the grinding apparatus 14, to bring the grindstones 30 into contact with the end face 6a (the cut surface on the side of not being coated with the resin layer 12) of the block ingot 6. Then, after the grindstones 30 are brought into contact with the end face 6a of the block ingot 6, the spindle 22 is lowered at a predetermined grinding feed rate (for example, 1.0 µm/second). By this, the end face 6a of the block ingot 6 is ground, and the end face 6a of the block ingot 6 can be planarized to such an extent as not to hinder incidence thereon of a pulsed laser beam LB in a separation layer forming step and a production history forming step which will be described later.

Figure 7:
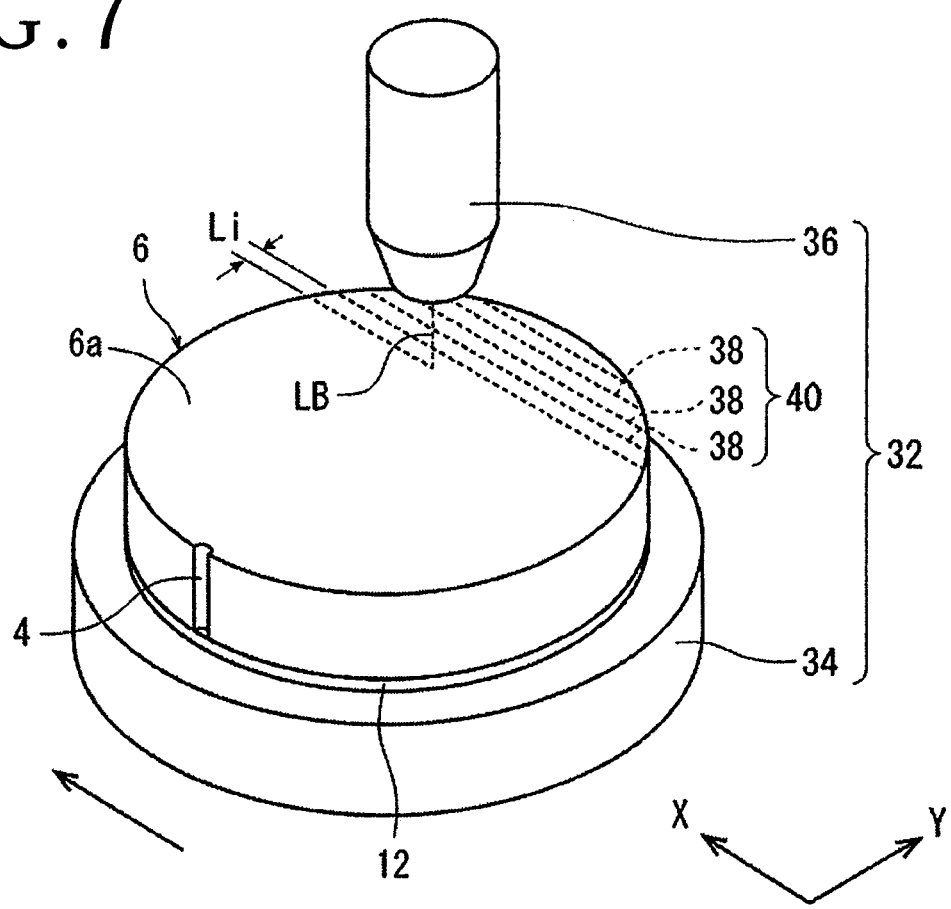
FIG. 7 is a perspective view depicting a state in which a separation layer forming step is being conducted.

After the planarizing step is conducted, a separation layer forming step is carried out in which a laser beam of such a wavelength as to be transmitted to silicon is applied to the block ingot 6, with a focal point of the laser beam positioned in the inside of the block ingot 6 at a depth from the end face 6a of the block ingot 6 corresponding to the thickness of the wafer to be formed, to form a separation layer. The separation layer forming step can be carried out by use of, for example, a laser processing apparatus 32 part of which is depicted in FIG. 7. The laser processing apparatus 32 includes a chuck table 34 that holds the ingot, a laser oscillator (not depicted) that oscillates a pulsed laser beam LB of such a wavelength as to be transmitted through silicon, an attenuator (not depicted) that adjusts the output of the pulsed laser beam LB oscillated by the laser oscillator, and a condenser 36 that focuses the pulsed laser beam LB adjusted in output by the attenuator to apply the pulsed laser beam LB to the ingot held by the chuck table 34. The cylindrical chuck table 34 configured to suction hold the ingot at an upper surface thereof is rotated by a rotating unit (not depicted) about an axis extending vertically while passing through a radial center of the chuck table 34, is advanced and retracted in an X-axis direction by an X-axis direction moving unit (not depicted), and is advanced and retracted in a Y-axis direction by a Y-axis direction moving unit (not depicted). Note that the X-axis direction is the direction indicated by arrow X in FIG. 7, and the Y-axis direction is the direction which is indicated by arrow Y in FIG. 7 and is orthogonal to the X-axis direction. A plane defined by the X-axis direction and the Y-axis direction is substantially horizontal.

Referring to FIG. 7, in the separation layer forming step, first, the block ingot 6 having the end face 6a planarized is suction held on the upper surface of the chuck table 34, with the resin layer 12 directed to the lower side. Next, the block ingot 6 is imaged from above by an imaging unit (not depicted) of the laser processing apparatus 32. Subsequently, based on an image picked up by the imaging unit, the chuck table 34 is moved by the X-axis direction moving unit and the Y-axis direction moving unit, to adjust the positions of the block ingot 6 and the condenser 36 in the XY plane. Next, the condenser 36 is moved in an optical axis direction (vertical direction) by a focal point position adjusting unit (not depicted) of the laser processing apparatus 32, to position the focal point at a depth from the end face 6a of the block ingot 6 having been planarized that corresponds to the thickness of the wafer to be formed.

Figure 8:
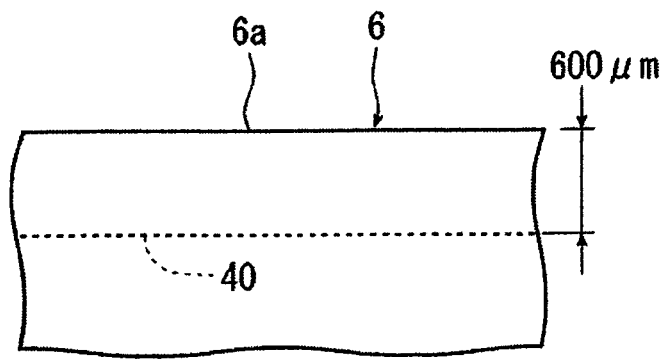
FIG. 8 is an enlarged side view of an upper portion of the block ingot formed with a separation layer.

Next, a separation layer forming process is carried out in which a pulsed laser beam LB of such a wavelength as to be transmitted through silicon is applied through the condenser 36 to the block ingot 6 while moving the chuck table 34 in the X-axis direction at a predetermined processing feed rate by the X-axis direction moving unit. When the separation layer forming process is performed, a rectilinear modified layer 38 is formed in the inside of the block ingot 6 by the application of the pulsed laser beam LB. Subsequently, the chuck table 34 is subjected to indexing feeding by a predetermined indexing amount Li in the Y-axis direction by the Y-axis direction moving unit. The separation layer forming process and the indexing feeding are alternately repeated, whereby a plurality of rectilinear modified layers 38 extending in the X-axis direction are formed in a stripe-like pattern at an interval of the predetermined indexing amount Li in the Y-axis direction. As a result of this, a separation layer 40 for separating the wafer from the block ingot 6, which layer is composed of the plurality of modified layers 38, can be formed at the depth from the end face 6a of the block ingot 6 corresponding to the thickness of the wafer to be formed, as depicted in FIG. 8. Such a separation layer forming step can be carried out, for example, under the following processing conditions.

Figure 9:
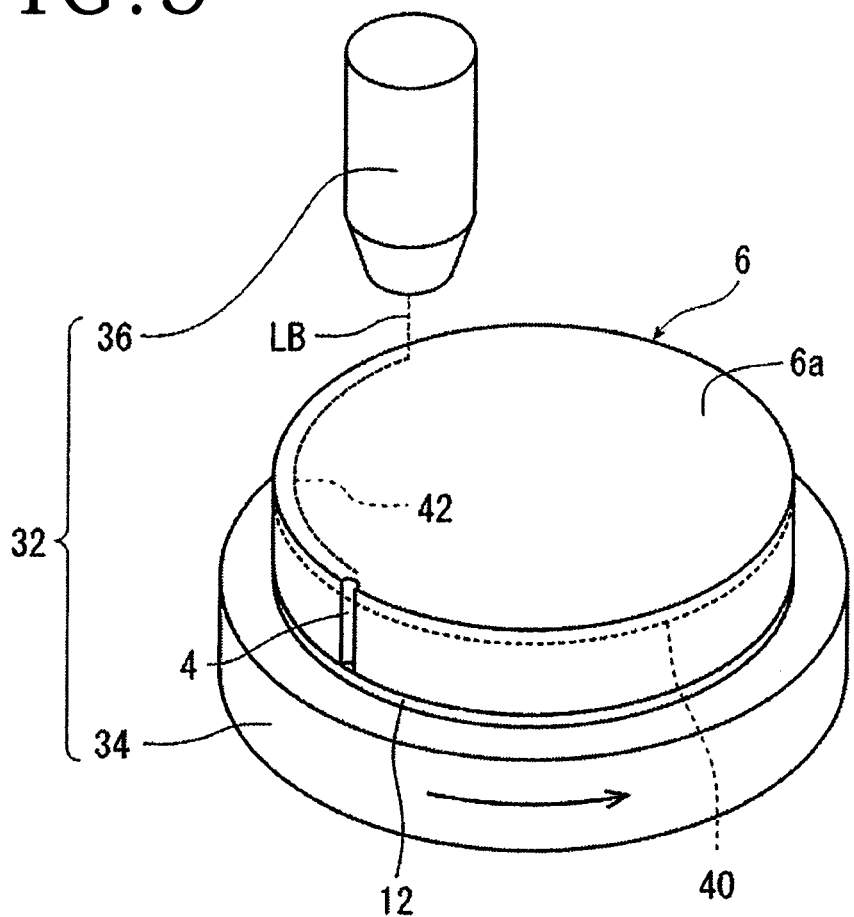
FIG. 9 is a perspective view depicting a state in which a production history forming step is being conducted.
Figure 10:
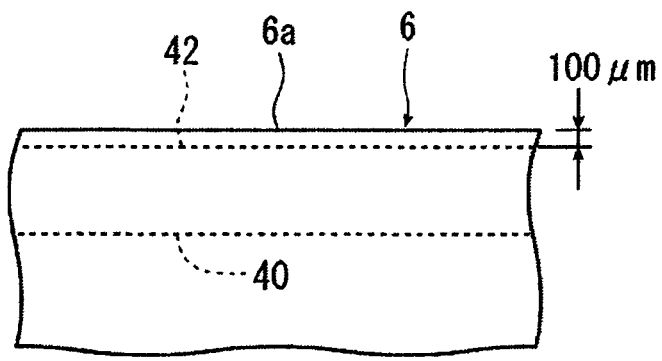
FIG. 10 is an enlarged side view of an upper portion of the block ingot formed with the separation layer and a production history.

Wavelength of pulsed laser beam: 1,064 to 1,300 nm
Repetition frequency: 80 kHz
Average output: 3.2 W
Pulse width: 4 nanoseconds
Diameter of focal point: 3 μm
Numerical aperture (NA) of focusing lens: 0.8
Z-axis directional position of focal point: 600 μm from end face of block ingot
Processing feed rate: 120 to 260 mm/second
Indexing amount: 10 to 30 μm In the present embodiment, after the separation layer forming step is conducted, a production history forming step is carried out in which a laser beam of such a wavelength as to be transmitted through silicon is applied to the wafer to be formed, with a focal point of the laser beam positioned in the inside of the wafer in a region not to be formed with devices, to form a production history. The production history forming step can be performed by use of the aforementioned laser processing apparatus 32. In the production history forming step, first, based on the image of the block ingot 6 picked up by the imaging unit of the laser processing apparatus 32 in the separation layer forming step, the chuck table 34 is moved by the X-axis direction moving unit or the Y-axis direction moving unit, to position the condenser 36 on the upper side of an outer peripheral marginal region, in which devices are not to be formed, of the wafer to be formed. Next, the condenser 36 is moved in the optical axis direction by the focal point position adjusting unit, to position the focal point in the inside of the outer peripheral marginal region of the wafer to be formed, from the end face 6a of the block ingot 6. Subsequently, while the block ingot 6 and the focal point are being relatively moved in an appropriate manner, a pulsed laser beam LB of such a wavelength as to be transmitted through silicon is applied through the condenser 36 to the wafer to be formed. As a result, a production history 42 which can be composed in the form of bar code can be formed in the inside of the outer peripheral marginal region of the wafer to be formed as depicted in FIGS. 9 and 10.

The production history 42 formed in the production history forming step preferably includes one of lot number of the block ingot 6, order of the wafer to be formed from the block ingot 6, date of production of the wafer, production facility of the wafer, and machine model contributing to the forming of the wafer. At the time of relatively moving the block ingot 6 and the focal point in the production history forming step, in the present embodiment, the block ingot 6 and the focal point can be relatively moved in the X-axis direction, the Y-axis direction and the circumferential direction of the block ingot 6, by use of the X-axis direction moving unit, the Y-axis direction moving unit and the rotating unit. The depth of the production history 42 formed in the inside of the wafer to be formed is set by spacing the production history 42 from the separation layer 40 formed in the separation layer forming step, such that when the separation layer of the wafer is ground and planarized after the separation of the wafer, the production history 42 is not removed. In regard of the output of the pulsed laser beam LB applied to the block ingot 6 in the production history forming step, the output of the pulsed laser beam LB oscillated by the laser oscillator may be appropriately adjusted by the attenuator, such as to be different from the output of the pulsed laser beam LB applied to the block ingot 6 in the separation layer forming step. Such a production history forming step can be carried out, for example, under the following processing conditions.

Figure 11:
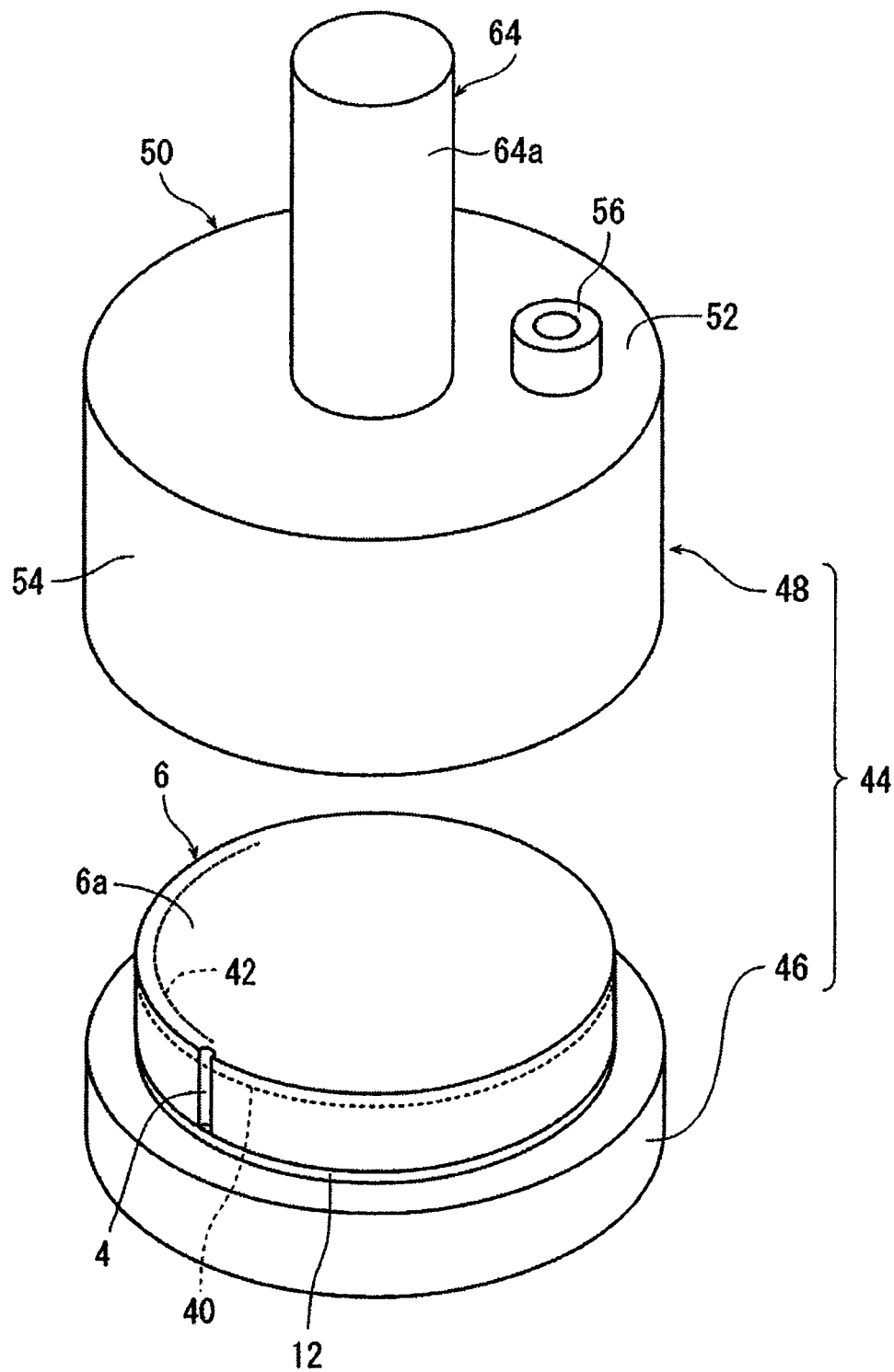
FIG. 11 is a perspective view depicting a state in which a liquid tank is located on the upper side of a chuck table of a separating apparatus.
Figure 12:
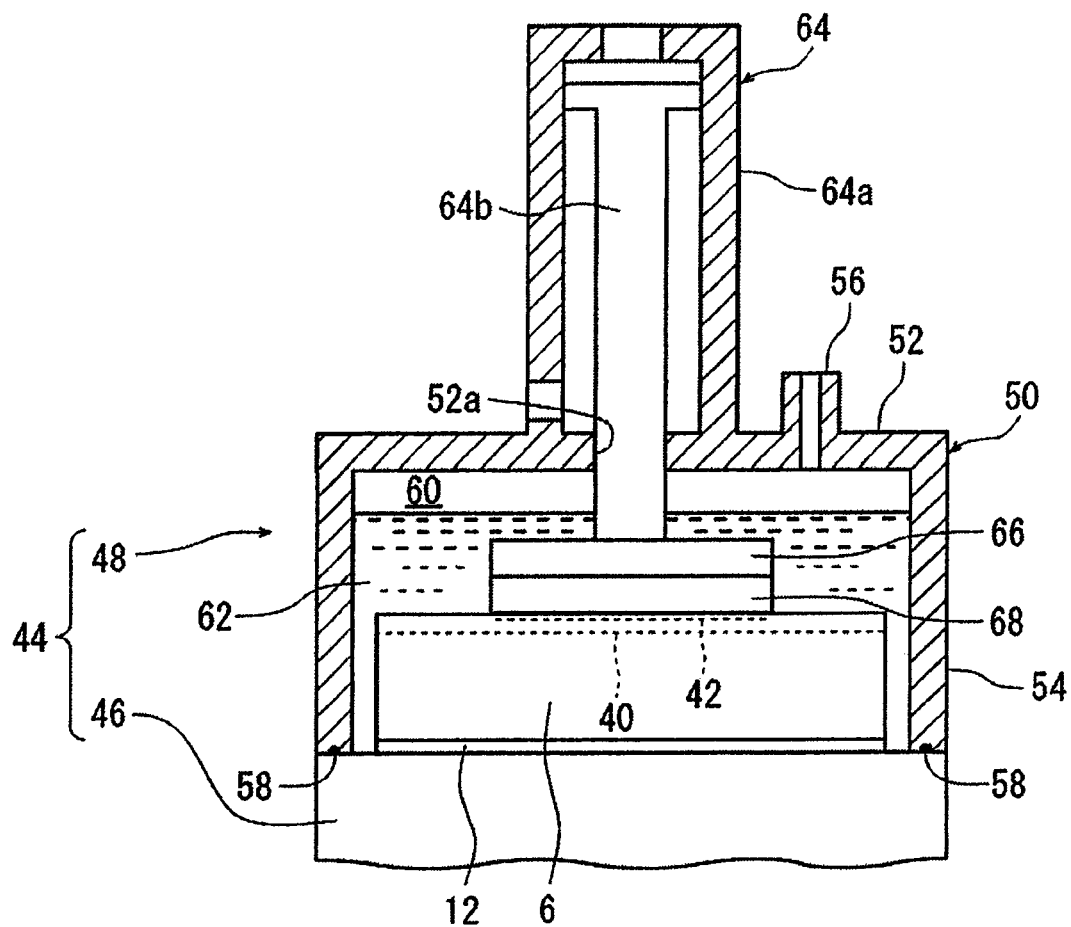
FIG. 12 is a sectional view depicting a state in which a wafer forming step is being conducted.
Figure 13:
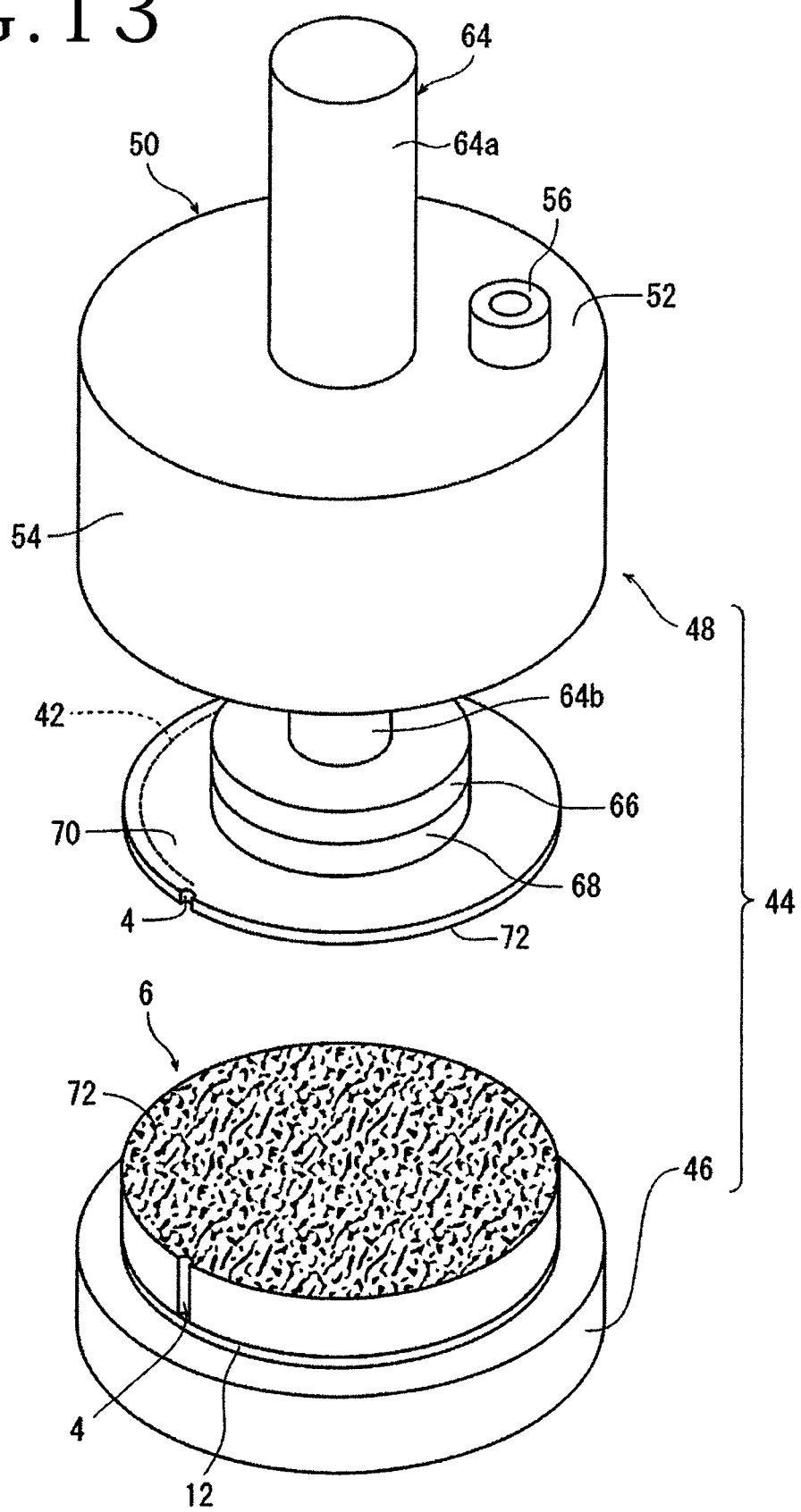
FIG. 13 is a perspective view depicting a state in which the silicon wafer is separated from the block ingot by the separating apparatus.

Wavelength of pulsed laser beam: 1,064 to 1,300 nm
Repetition frequency: 80 kHz
Average output: 1.0 W
Pulse width: 4 nanoseconds
Diameter of focal point: 3 μm
Numerical aperture (NA) of focusing lens: 0.8
Z-axis directional position of focal point: 100 μm from end face of block ingot After the production history forming step is conducted, a wafer forming step of separating the wafer to be formed from the separation layer 40 is performed. The wafer forming step can be carried out, for example, by use of a separating apparatus 44 part of which is depicted in FIGS. 11 to 13. The separating apparatus 44 includes a chuck table 46 that holds an ingot, and a separating unit 48 that holds an upper surface of the ingot held by the chuck table 46 and separates the wafer from the ingot, with the separation layer as a starting point of separation. The cylindrical chuck table 46 is configured to suction hold the ingot at an upper surface thereof. The separating unit 48 includes a liquid tank 50 that accommodates a liquid in cooperation with the chuck table 46. The liquid tank 50, which is moved upward and downward by an appropriate lift unit (not depicted), includes a circular top surface wall 52, and a cylindrical side wall 54 drooping from a peripheral edge of the top surface wall 52, and is opened on the lower end side. A cylindrical liquid supply section 56 providing communication between the outside and the inside of the liquid tank 50 is additionally provided at the top surface wall 52, and the liquid supply section 56 is connected to liquid supply means (not depicted) through a passage. As depicted in FIG. 12, an annular packing 58 is additionally provided at a lower end of the side wall 54. When the liquid tank 50 is lowered and the lower end of the side wall 54 makes close contact with the upper surface of the chuck table 46, a liquid accommodating space 60 is defined by the upper surface of the chuck table 46 and an inner surface of the liquid tank 50. A liquid 62 supplied from the liquid supply means into the liquid accommodating space 60 through the liquid supply section 56 is prevented by the packing 58 from leaking out of the liquid accommodating space 60. As depicted in FIG. 12, an air cylinder 64 is mounted to the top surface wall 52 of the liquid tank 50, and a cylinder tube 64a of the air cylinder 64 extends upward from the upper surface of the top surface wall 52. A piston rod 64b of the air cylinder 64 passes through a through-hole 52a of the top surface wall 52 and protrudes to the lower side of the top surface wall 52, and a circular disk-shaped ultrasonic vibration generating member 66 which can be formed from a piezoelectric ceramic or the like is fixed to a lower end portion of the piston rod 64b. A circular disk-shaped suction piece 68 is fixed to a lower surface of the ultrasonic vibration generating member 66. The suction piece 68 is configured to suction hold the ingot at a lower surface thereof.

In the wafer forming step, first, the block ingot 6 formed with the separation layer 40 and the production history 42 is suction held on the upper surface of the chuck table 46, with the resin layer 12 directed to the lower side. Next, as depicted in FIG. 12, the liquid tank 50 is lowered by the lift unit, and the lower end of the side wall 54 of the liquid tank 50 is put into close contact with the upper surface of the chuck table 46. Subsequently, the piston rod 64b of the air cylinder 64 is moved, and the lower surface of the suction piece 68 is made to suction hold the end face 6a of the block ingot 6. Next, the liquid supply means connected to the liquid supply section 56 is operated, to supply the liquid 62 (for example, water) into the liquid accommodating space 60 until the ultrasonic vibration generating member 66 is immersed. Subsequently, the ultrasonic vibration generating member 66 is operated to apply ultrasonic vibration to the block ingot 6, whereby a wafer 70 to be formed can be separated from the block ingot 6, with the separation layer 40 as a starting point of separation. Next, the liquid tank 50 is moved upward by the lift unit, to discharge the liquid 62 from the liquid accommodating space 60. Subsequently, as depicted in FIG. 13, the piston rod 64b of the air cylinder 64 is lowered until the wafer 70 formed from the block ingot 6 protrudes downward beyond the lower end of the side wall 54 of the liquid tank 50. Separation surfaces 72 of the wafer 70 and the block ingot 6 are rugged, and the height of the ruggedness of the separation surfaces 72 is, for example, approximately 100 μm. Note that the wafer 70 thus separated is conveyed, from the state depicted in FIG. 13, to a wafer grinding apparatus which can be composed of the same components as those of the aforementioned grinding apparatus 14, and the separation surface 72 is ground to be planarized, after which a plurality of devices such as ICs and LSIs are formed in the state of being partitioned by division lines (streets).

Then, the block ingot 6 is repeatedly subjected to the planarizing step, the separation layer forming step, the production history forming step and the wafer forming step, whereby a plurality of wafers 70 are formed from the block ingot 6. A grinding amount for the separation surface 72 of the block ingot 6 in the planarizing step after the wafer forming step is conducted need only be an amount (approximately 100 μm) of the height of the ruggedness of the separation surface 72; therefore, the grinding amount is sufficiently small as compared to the margin for slicing of the block ingot 6 in the case where the block ingot 6 is sliced by a wire saw or an inner saw to form wafers. Accordingly, in the present embodiment as aforementioned, the margin for slicing of the silicon ingot 2 can be reduced, and the wafers 70 can be efficiently formed from the silicon ingot 2.

In the present embodiment, the production history forming step is included in which the production history 42 is formed in the inside of the outer peripheral marginal region of the wafer 70 to be formed which region is not to be formed with devices. Therefore, in the process of forming devices in the wafer 70, the production history 42 of the wafer 70 that is formed in the inside of the wafer 70 can be confirmed. Accordingly, in the wafer 70 formed by the wafer forming method in the present embodiment, if a defect is generated in the device formed in the wafer 70, the cause of the defect in the device can be investigated by tracing back the production history 42 of the wafer 70. This can lead to prevention of recurrence of the defect in the device.

Note that in the present embodiment, an example in which the block ingot 6 is suction held on each of the chuck tables 16, 34 and 46 of the grinding apparatus 14, the laser processing apparatus 32 and the separating apparatus 44 has been described. However, a configuration may be adopted in which the chuck tables 16, 34 and 46 of the grinding apparatus 14, the laser processing apparatus 32 and the separating apparatus 44 are the same one chuck table, the one chuck table being moved between the grinding apparatus 14, the laser processing apparatus 32 and the separating apparatus 44, and the block ingot 6 is fixed to the chuck table through an appropriate adhesive such as an epoxy resin adhesive. In this case, the block ingot 6 can be fixed to each of the chuck tables 16, 34 and 46 even if the end face 6a as the cut surface of the block ingot 6 is not flat; therefore, the resin layer coating step of coating one of the end faces 6a of the block ingot 6 with the resin layer 12 having a flat outer surface may not be performed.

In the present embodiment, an example in which the base member 8 is peeled from the resin layer 12 in the resin layer coating step has been described. However, the planarizing step, the separation layer forming step, the production history forming step and the wafer forming step may be carried out, without peeling the base member 8 from the resin layer 12.

In the present embodiment, an example has been described in which in the separation layer forming step, the separation layer forming process of applying the pulsed laser beam LB to the block ingot 6 while moving the chuck table 34 of the laser processing apparatus 32 in the X-axis direction and the indexing feeding of the chuck table 34 in the Y-axis direction are alternately repeated, to form a plurality of rectilinear modified layers 38 in the inside of the block ingot 6 in a stripe-like pattern at an interval of a predetermined indexing amount Li. However, the separation layer forming step is not limited to the aforementioned mode. For example, in the separation layer forming step, with the focal point of the pulsed laser beam LB positioned in the radial center of the block ingot 6, the pulsed laser beam LB may be applied to the block ingot 6 while rotating the chuck table 34 and moving the chuck table 34 radially outward in relation to the focal point, so as to form a separation layer composed of a spiral modified layer. In addition, in the separation layer forming step, the separation layer forming process of applying the pulsed laser beam LB to the block ingot 6 while rotating the chuck table 34 and indexing feeding of the chuck table 34 in the radial direction may be alternately repeated, so as to form a separation layer composed of a plurality of concentric circular modified layers.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A silicon wafer forming method for forming a silicon wafer from a silicon ingot, the method comprising:
   a block ingot forming step of cutting the silicon ingot to form a block ingot having a first end face and a second end face;

a resin layer coating step of coating the second end face of the block ingot with a resin to form a resin layer on the second end face;

a planarizing step of grinding the first end face of the block ingot to planarize the first end face;

a separation layer forming step of applying a laser beam of such a wavelength as to be transmitted through silicon to the block ingot, with a focal point of the laser beam positioned inside of the block ingot at a depth from the first end face of the block ingot that is between the first end face and the second end face coated with resin to form a separation layer, the depth corresponding to the thickness of the wafer to be formed; and a wafer forming step of separating the silicon wafer to be formed from the separation layer, after the separation layer forming step is performed, by immersing the block ingot in a liquid and generating an ultrasonic vibration.

2. The silicon wafer forming method according to claim 1, further comprising:

a crystal orientation forming step of forming the silicon ingot with an orientation flat or a notch indicative of crystal orientation, before the block ingot forming step.

3. The silicon wafer forming method according to claim 1, further comprising:

a production history forming step of applying a laser beam of such a wavelength as to be transmitted through silicon to the silicon wafer to be formed, with a focal point of the laser beam positioned in the inside of the silicon wafer to be formed in a region not to be formed with devices, to form a production history.

4. The silicon wafer forming method according to claim 3, wherein the production history formed in the production history forming step includes one of lot number of the block ingot, order of the wafer to be formed, date of production, production facility, and machine model contributing to the forming.

5. The silicon wafer forming method according to claim 1, wherein the resin layer coating step includes applying a resin to a base member and placing the base member against the second end face of the block ingot so that a solid resin layer is formed between the base member and the second end face of the block ingot, and removing the base member so that the solid resin layer remains on the second end face of the block ingot.

6. The silicon wafer forming method according to claim 5, further comprising a peeling step of peeling the base member from the resin layer.

7. A silicon wafer forming method for forming a silicon wafer from a silicon ingot, the method comprising:

a block ingot forming step of cutting the silicon ingot to form a block ingot having a first end face and a second end face;

a fixing step of fixing the second face of the block ingot to a chuck table using an adhesive and transporting the block ingot on the chuck table between different processes;

a planarizing step of grinding the first end face of the block ingot to planarize the first end face;

a separation layer forming step of applying a laser beam of such a wavelength as to be transmitted through silicon to the block ingot, with a focal point of the laser beam positioned inside of the block ingot at a depth from the first end face of the block ingot that is between the first end face and the second end face to form a separation layer, the depth corresponding to the thickness of the wafer to be formed; and a wafer forming step of separating the silicon wafer to be formed from the separation layer, after the separation layer forming step is performed, by immersing the block ingot in a liquid, applying ultrasonic vibration to the block ingot and applying suction to remove each wafer from the block ingot.

8. The silicon wafer forming method according to claim 7, wherein the fixing step includes fixing the second end face of the block ingot to different chuck tables using an adhesive, a different one of the chuck tables being used in the planarizing step, the separation layer forming step and the wafer forming step.

\* \* \* \* \*